United States Patent
Wang et al.

(10) Patent No.: US 6,197,700 B1
(45) Date of Patent: Mar. 6, 2001

(54) FABRICATION METHOD FOR BOTTOM ELECTRODE OF CAPACITOR

(75) Inventors: Chuan-Fu Wang, Taipei Hsien; Jung-Chao Chiou, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/375,179

(22) Filed: Aug. 16, 1999

(51) Int. Cl.⁷ .................. H01L 21/302; H01L 21/461
(52) U.S. Cl. .............................. 438/745; 754/756
(58) Field of Search .................... 438/745, 754, 438/756

(56) References Cited

U.S. PATENT DOCUMENTS 5,380,673 * 1/1995 Yang et al. .................... 438/396
5,650,349 * 7/1997 Prall et al. .................... 438/307
5,731,130 * 3/1998 Tseng .................... 430/316

* cited by examiner

Primary Examiner—Benjamin L. Utech
Assistant Examiner—Lynette T. Umez-Eronini
(74) Attorney, Agent, or Firm—Oppenheimer Wolff & Donnelly LLP

(57) ABSTRACT

A method of fabricating a bottom electrode for a capacitor is described in which a dielectric layer is formed on a substrate already comprising an isolation layer, an etching stop layer and a landing pad. Bit line structures and spacers are further formed on the dielectric layer. A node contact window opening is formed in the dielectric layer, exposing the landing pad, and a conformal first conductive layer is formed on the substrate. After a specially patterned mask layer is formed and the exposed first conductive layer is removed, an extended portion is formed connecting to the conductive layer to complete the fabrication of the columnar bottom electrode for a capacitor.

17 Claims, 4 Drawing Sheets

FABRICATION METHOD FOR BOTTOM ELECTRODE OF CAPACITOR

BACKGROUND OF THE INVENTION

1. Field of the Invention

The present invention relates to a fabrication method for a bottom electrode of a capacitor. More particularly, the present invention relates to a fabrication method for a landing pad of a capacitor.

2. Description of the Related Art

As the density of integrated circuits increases, the formation of a contact node in the manufacturing of a capacitor usually employs a self-aligned contact window approach. Since the aspect ratio of the desired opening formed in the self-aligned contact window process is often too high, the quality of the etching is reduced and the etching conditions become more difficult to control.

FIGS. 1A and 1B are schematic, cross-sectional views of a self-aligned contact window showing the steps for manufacturing a self-aligned contact window according to the conventional methods.

Referring to FIG. 1A, a substrate 100 comprising an isolation layer 102, an etching stop layer 104 and a landing pad 106 is provided. A dielectric layer 108 is then formed covering the entire substrate 100, followed by forming bit line structures 110 and spacers 112 on the dielectric layer 108. The bit line structures 110 comprise a polysilicon layer 114, an adhesive layer 116 and a protective layer 118. Since the protective layer 118, for example, is a nitride layer and the dielectric layer 108, for example, is an oxide layer, the protective layer and the dielectric layer thereby exhibit a higher etching ratio. The adhesive layer 116, for example, tungsten or a tungsten silicide material, is used to enhance the adhesion between the polysilicon layer 114 and the protective layer 118.

As shown in FIG. 1B, an oxide layer 120 is formed, covering the entire substrate 100. Anisotropic etching is conducted, by means of a photolithography and etching technique, to remove the dielectric layer 108 and the oxide layer 120 above the landing pad 106. A contact window opening 122 is thus formed, exposing the landing pad 106. Since the position in forming the node contact window opening 122 is not completely aligned with the landing pad, the bit line structure 110 is etched. Since the bit line structure 110 includes the protective layer 118, the bit line structure 110 is protected from further etching by the protective layer 118.

The aspect ratio of the node contact window opening 122 formed by the above approach is, however, too high. The dielectric layer 108 and the oxide layer 120 in the node contact window opening 122 are thereby not completely removed (not shown in Figure), resulting in an incomplete exposure of the landing pad 106. Furthermore, although the protective layer 118 has a different etching ratio from the oxide material, it is more difficult to control the etching condition because the node contact window opening formed by this approach is too deep. If the etching condition is inappropriate or the etching period is too long, the protective layer is etched away and the adhesive layer 116 of the bit line structure 110 is exposed while forming the node contact window opening 122.

SUMMARY OF THE INVENTION

The current invention provides a fabrication method for a bottom electrode of a capacitor, in which a dielectric layer is formed on a substrate already comprising an isolation layer, an etching stop layer and a landing pad. Bit line structures and spacers are further formed on the dielectric layer. The bit line structures comprise a polysilicon layer, an adhesive layer, a protective layer and an oxide layer. The spacers are located on the sidewalls of the bit line structures. The oxide layer of the bit line structures and a portion of the dielectric layer are further removed to form a node contact window opening in the dielectric layer exposing the landing pad. A conformal first conductive layer is formed on the substrate, and a patterned mask layer is formed on the first conductive layer. The mask layer only covers the first conductive layer between the bit line structures, and a portion of the first conductive layer is thereby exposed. An etching-back technique is used to remove the exposed first conductive layer, followed by forming a conformal second conductive layer to cover the entire substrate. Another etching-back procedure is performed to remove a portion of the second conductive layer to form an extended portion connecting to the first conductive layer, and to remove the mask layer.

One of the salient features of the present invention is that the formation of a bottom electrode for a capacitor is conducted in two separate steps. First, a first conductive layer is formed connecting to the landing pad in the node contact window opening, after which a patterned mask layer and a conformal second conductive layer on the substrate are formed, followed by an etching-back procedure on the second conductive layer to form the extended portion which is connected to the landing pad. The first conductive layer and the extended portion together form the bottom electrode for the capacitor. Since only the dielectric layer above the landing pad is removed when forming the node contact window opening, the dielectric layer above the landing pad is guaranteed to be completely removed during the etching process. Furthermore, the node contact window opening formed according to the present invention is shallow. Even if the position of the node contact window opening is not completely aligned with the landing pad, only a limited portion of the protective layer in the bit line structure is etched away. The etching conditions thus have a greater tolerance for error and the etching process is therefore easier to control.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1A:
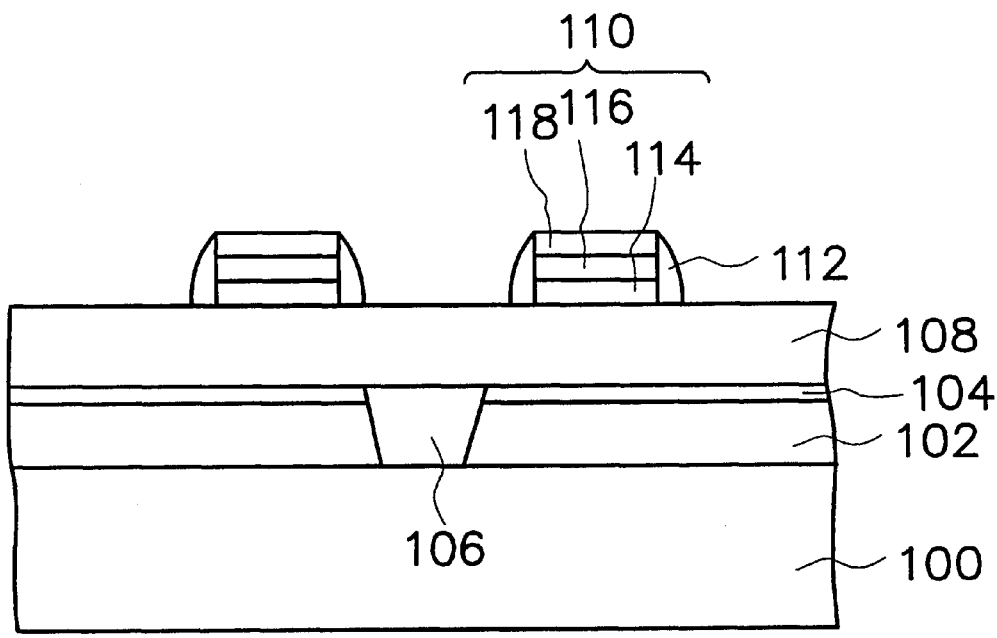
FIGS. 1A to 1B are schematic, cross-sectional views of a self-aligned contact window showing the manufacturing steps of a self-aligned contact window according to the conventional method.
Figure 1B:
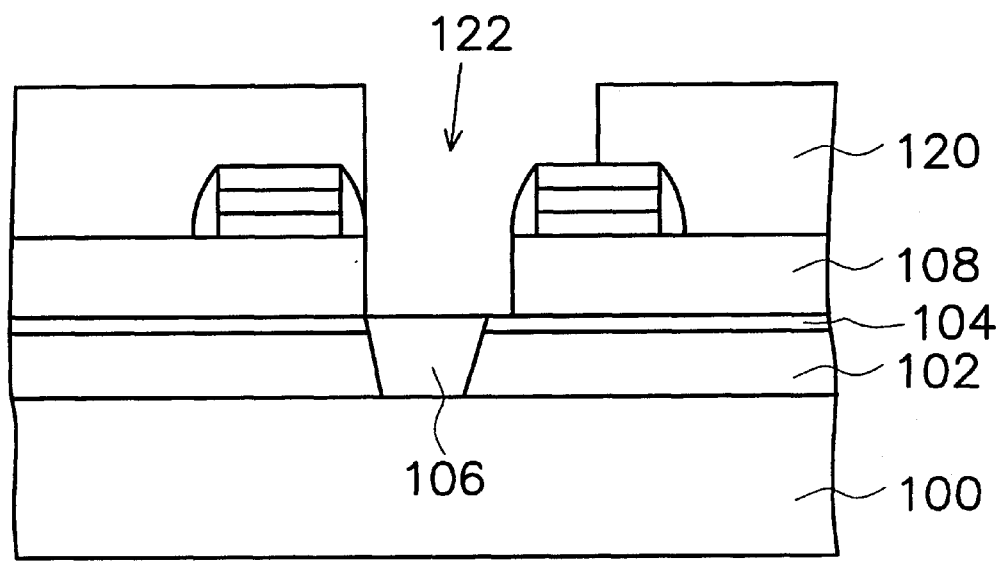
Figure 2A:
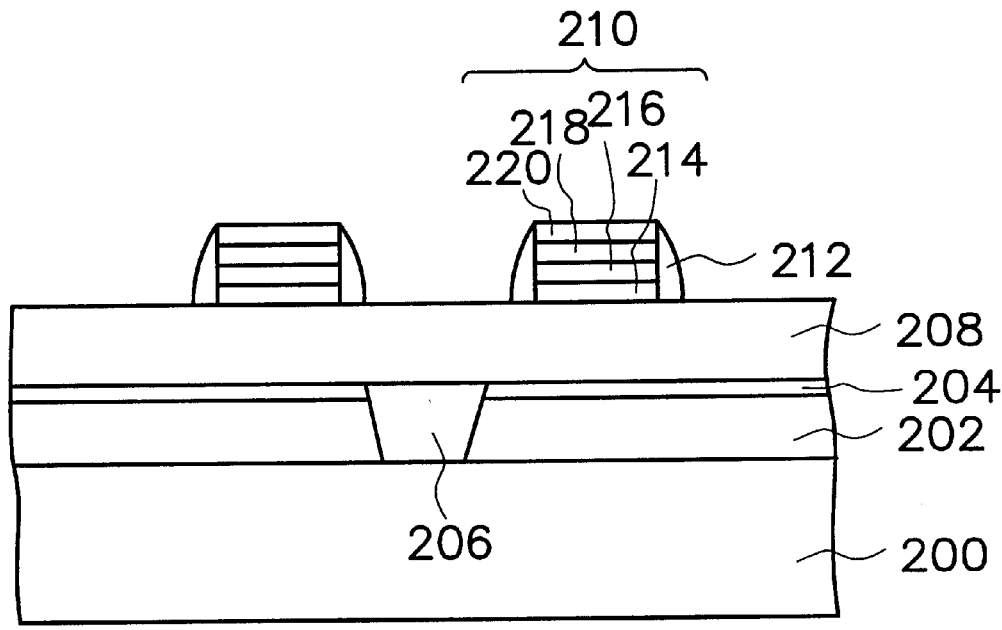
FIGS. 2A to 2F are schematic, cross-sectional views of a self-aligned contact window showing the manufacturing steps of a self-aligned contact window according to the preferred embodiment of the present invention.

Referring to FIG. 2A, an isolation layer 202, an etching stop layer 204 and a landing pad 206 are already formed on a substrate 200. The landing pad 206 is formed penetrating through the etching stop layer 204 and the isolation layer 202 to couple a part of the substrate 200. A dielectric layer 208 is deposited, covering the etching stop layer 204 and the exposed landing pad 206, followed by forming a plurality of bit line structures 210 and spacers 212 on the dielectric layer 208. The spacers 212 and the bit line structures 210 are located, for example, above both sides of the landing pad 206. The bit line structures 210 comprise a polysilicon layer 214, an adhesive layer 216, a protective layer 218 and an oxide layer 220. The adhesive layer 216 includes, for example, a tungsten layer, a tungsten silicide layer or a combination of the two. The protective layer is formed, for example, with a nitride material. Methods to form the bit line structures 210 and the spacers 212 include sequentially forming the polysilicon layer 214, the adhesive layer 216, the protective layer 218 and the oxide layer 220 on the substrate 200. The bit line structures 210 are further defined using a photolithography and etching technique to form a conformal nitride layer (not shown in Figure) on the substrate 200. A portion of the nitride layer is then removed by means of an etching-back technique to form the spacers 212, which are on the sidewalls of the bit line structures 210.

Figure 2B:
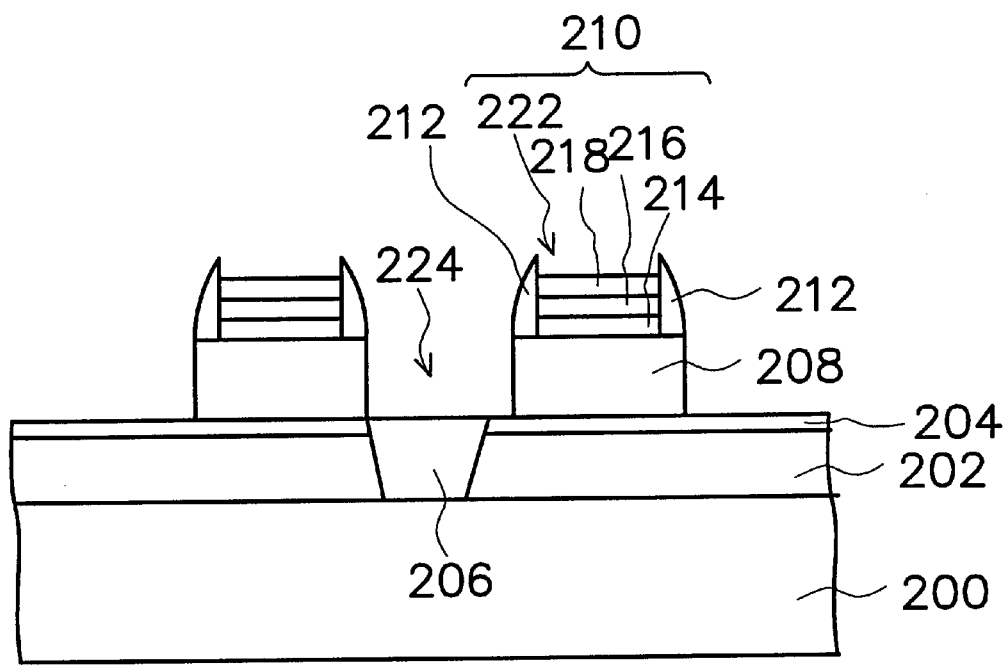

As shown in FIG. 2B, using the protective layer 218 and the etching stop layer 204 as etching stops, an etching-back procedure is conducted to remove the oxide layer 220 of the bit line structure 210 and a portion of the dielectric layer 208. The bit line structure has a top surface lower than the top portions of the spacer 212 after the oxide layer 220 of the bit line structure 210 is removed, thereby forming a concavity 222 with the spacers 212 and the bit line structure 210. The portion of the dielectric layer 208, which is not covered by the bit line structures and the spacers, is partially removed to form a node contact window opening 224, exposing the landing pad 206.

Figure 2C:
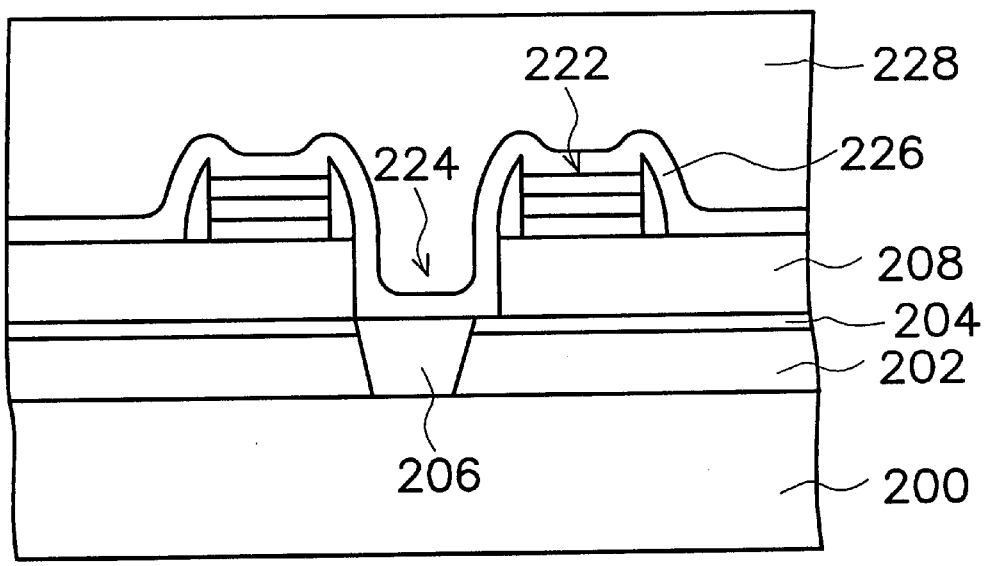

As shown in FIG. 2C, a conformal first conductive layer 226 is formed on the substrate 200. The first conductive layer 226, for example, a polysilicon layer, is formed by a process including chemical vapor deposition. The first conductive layer 226 is connected to the landing pad 206 in the node contact window opening 224. A mask layer 228 is then formed covering the first conductive layer 226 and filling the node contact window opening 224 and the concavity 222. A process including chemical vapor deposition is used to form the mask layer 228, such as an oxide material.

Figure 2D:
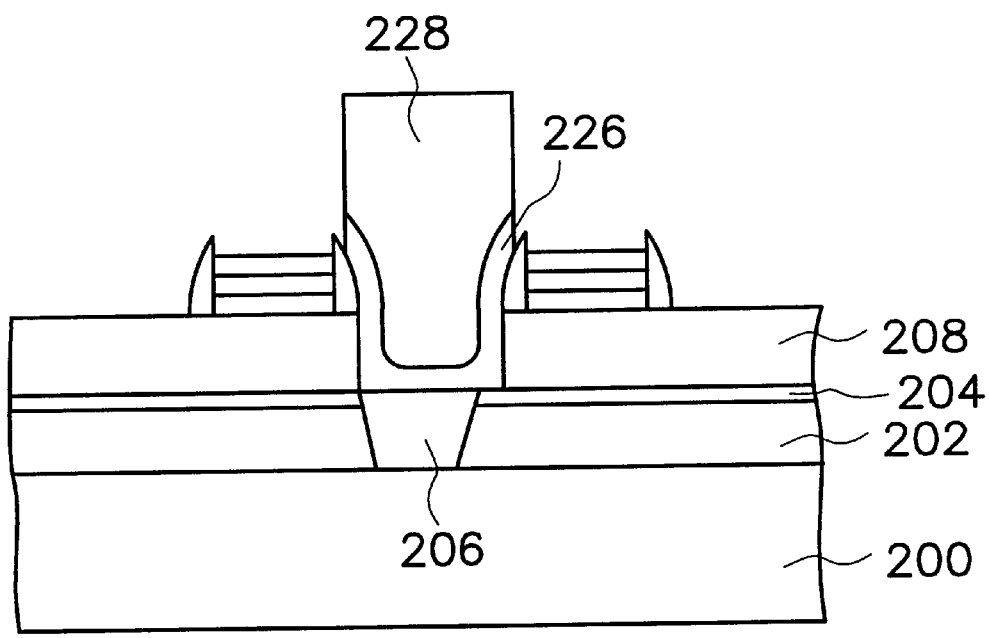

Referring to FIG. 2D, a portion of the mask layer 228 is removed to form a pattern by means of, for example, a photolithography and etching technique, leaving only the mask layer 228 above the landing pad 206 and the spacers 212. Thereafter, an etching process is conducted to remove the exposed first conductive layer 226 with the mask layer 228 serving as an etching mask.

Figure 2E:
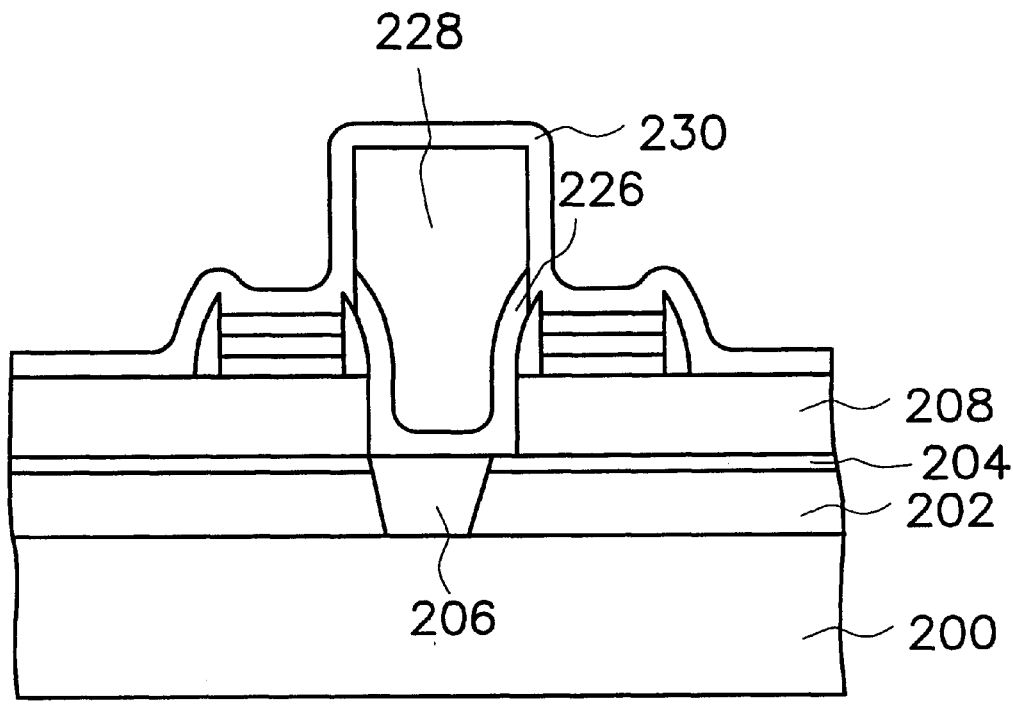

According to FIG. 2E, a conformal second conductive layer 230 is formed on the substrate 200 to cover the surfaces of the bit line structures 210 (FIG. 2B), the spacers 212 (FIG. 2A) and the mask layer 228. The second conductive layer 230, such as a polysilicon layer, is formed by chemical vapor deposition, for example.

Figure 2F:
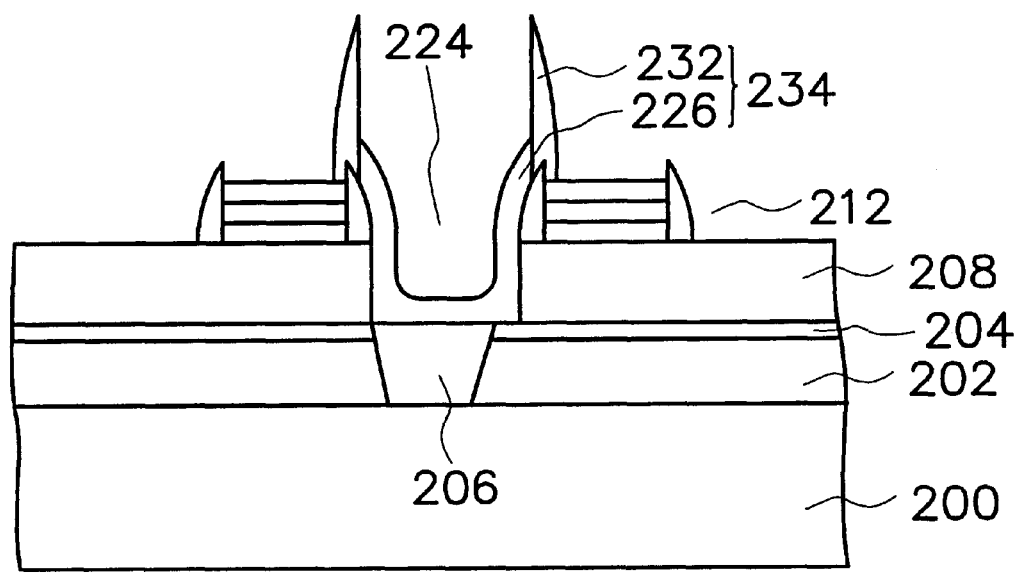

As shown in FIG. 2F, a etching-back procedure is conducted to partially remove the second conductive layer 230, leaving only an extended portion 232 on the sidewalls of the mask layer 228 (FIG. 2E) to complete the formation of the bottom electrode for the capacitor. The first conductive layer 226 and the extended portion 232 together form the bottom electrode 234 for the capacitor. The extended portion 232, for example, has a columnar shape. The mask layer 228 is further removed by methods such as a wet dip.

An advantage of the present invention is that the formation of the bottom electrode for the capacitor is conducted in two separate steps. First, the first conductive layer is formed, connecting to the landing pad in the node contact window opening, after which a specially patterned mask layer and a conformal second conductive layer on the substrate are formed, followed by an etching-back procedure on the second conductive layer to form the extended portion which is connected to the first conductive layer. The first conductive layer and the extended portion form the bottom electrode for the capacitor. Since only the dielectric layer above the landing pad is removed when forming the node contact window opening formed according to the present invention, the dielectric layer above the landing pad is guaranteed to be completely removed during the etching process. Furthermore, the node contact window opening is shallow. Even if the position of the nod contact window opening is not completely aligned with the landing pad, only a limited portion of the protective layer in the bit line structure is etched away. The etching process thus has a greater tolerance for error, and the etching process is therefore easier to control.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a bottom electrode of a capacitor, comprising the steps of:

providing a substrate with an isolation layer and an etching stop layer, wherein a landing pad is formed in the isolation layer and the etching stop layer with a surface of the landing pad is exposed;

forming a dielectric layer to cover the etching stop layer and the exposed surface of the landing pad;

forming a bit line structure and a spacer above at both sides of the landing pad on the dielectric layer, wherein the spacer is formed on a sidewall of the bit line structure and the bit line structure includes a polysilicon layer, an adhesive layer, a protective layer and an oxide layer;

removing the oxide layer of the bit line structure and a portion of the dielectric layer, wherein the bit line structure has a top surface lower than the top portions of the spacer forming a concavity with the spacer and the bit line structure, and forming a node contact window opening in the dielectric layer such that the node contact window opening exposes the landing pad;

forming a conformal first conductive layer on the substrate;

removing a portion of the mask layer to expose the first conductive layer except for a portion of the first conductive layer in the node contact window;

removing the exposed first conductive layer;

forming an extended portion at the sidewall of the mask layer wherein the extended portion is connected to the first conductive layer; and removing the mask layer.

2. The fabrication method for a bottom electrode of a capacitor according to claim 1, wherein forming the bit line structure comprises the steps of:

forming a polysilicon layer to cover the dielectric layer;

forming an adhesive layer to cover the polysilicon layer;

forming a protective layer to cover the adhesive layer;

forming an oxide layer to cover the protective layer; and removing a portion of the oxide layer, the protective layer, the adhesive layer and the polysilicon layer.

3. The fabrication method for a bottom electrode of a capacitor according to claim 1, wherein the protective layer includes a nitride material.

4. The fabrication method for a bottom electrode of a capacitor according to claim 1, wherein the adhesive layer is a material selected from the group consisting of tungsten, a tungsten silicide material and a combination of the two.

5. The fabrication method for a bottom electrode of a capacitor according to claim 1, wherein the spacer includes a nitride material.

6. The fabrication method for a bottom electrode of a capacitor according to claim 1, wherein the oxide layer and a portion of the dielectric layer are removed by an etching-back procedure.

7. The fabrication method for a bottom electrode of a capacitor according to claim 1, wherein the mask layer includes an oxide material.

8. The fabrication method for a bottom electrode of a capacitor according to claim 1, wherein the extended portion includes a polysilicon material.

9. The fabrication method for a bottom electrode of a capacitor according to claim 1, wherein forming the extended portion comprises the steps of:

forming a conformal second conductive layer on the substrate; and conducting an etching-back procedure to partially remove the second conductive layer.

10. The fabrication method for a bottom electrode of a capacitor according to claim 1, wherein the mask layer is removed by wet etching.

11. A fabrication method for a bottom electrode of a capacitor, which is applicable to a substrate comprising an isolation layer, an etching stop layer and a landing pad formed thereon, wherein the etching stop layer is located on the isolation layer, and the landing pad having a surface exposed is located in the isolation layer and the etching stop layer, the method comprising the steps of:

forming a dielectric layer to cover the etching stop layer and the exposed surface of the landing pad;

forming a plurality of bit line structures and a plurality of spacers wherein the bit line structures are located on the dielectric layer above both sides of the landing pad with the spacers formed on the sidewalls of the bit line structures;

removing a portion of the dielectric layer to form a node contact window opening between the bit line structures, wherein the node contact window opening exposes the landing pad;

forming a first conductive layer in the node contact window opening wherein the first conductive layer and the landing pad are connected; and forming an extended portion to connect with the first conductive layer.

12. The fabrication method for a bottom electrode of a capacitor according to claim 11, wherein the first conductive layer includes a polysilicon layer.

13. The fabrication method for a bottom electrode of a capacitor according to claim 11, wherein forming the first conductive layer comprises the steps of:

forming a conformal first conductive layer; and removing a portion of the first conductive layer.

14. The fabrication method for a bottom electrode of a capacitor according to claim 11, wherein the bit line structure comprises a polysilicon layer, an adhesive layer and a protective layer.

15. The fabrication method for a bottom electrode of a capacitor according to claim 14, wherein the adhesive layer is a material selected from the group consisting of tungsten, a tungsten silicide material and a combination of the two.

16. The fabrication method for a bottom electrode of a capacitor according to claim 14, wherein the protective layer includes an nitride material.

17. The fabrication method for a bottom electrode of a capacitor according to claim 11, wherein the spacer includes a nitride material.

* * * * *